United States Patent
Hook et al.

(10) Patent No.: US 7,682,910 B2
(45) Date of Patent: Mar. 23, 2010

(54) METHOD OF SELECTIVELY ADJUSTING ION IMPLANTATION DOSE ON SEMICONDUCTOR DEVICES

(75) Inventors: Terence B. Hook, Jericho, VT (US); Gerald Leake, Jr., Wallkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/101,323

(22) Filed: Apr. 11, 2008

(65) Prior Publication Data

US 2009/0258480 A1    Oct. 15, 2009

(51) Int. Cl.
*H01L 21/8236* (2006.01)
*H01L 21/75* (2006.01)
*H01L 21/336* (2006.01)

(52) U.S. Cl. .............. 438/276; 438/298; 438/450; 438/451

(58) Field of Classification Search .......... 438/276, 438/298, 450, 451, 982; 257/E21.557
See application file for complete search history.

(56) References Cited

U.S. PATENT DOCUMENTS

| | | | |
|---|---|---|---|
| 4,938,841 A | 7/1990 | Shahar et al. | |
| 6,489,223 B1 | 12/2002 | Hook et al. | |
| 6,617,218 B2 | 9/2003 | Kawashima | |
| 6,782,516 B2 | 8/2004 | Rittman et al. | |
| 7,052,965 B2 | 5/2006 | Park et al. | |
| 7,132,340 B2 | 11/2006 | Sadra et al. | |
| 7,233,101 B2 | 6/2007 | Jin | |
| 2001/0046758 A1* | 11/2001 | Rodder | 438/525 |
| 2003/0008484 A1* | 1/2003 | Hook | 438/524 |
| 2009/0081860 A1* | 3/2009 | Zhou et al. | 438/531 |

* cited by examiner

*Primary Examiner*—William M. Brewster
(74) *Attorney, Agent, or Firm*—Scully, Scott, Murphy & Presser, P.C.; W. Riyon Harding

(57) ABSTRACT

A first semiconductor region and a second semiconductor region separated by a shallow trench isolation region are formed in a semiconductor substrate. A photoresist is applied and patterned so that the first semiconductor region is exposed, while the second semiconductor region is covered. Depending on the setting of parameters for the location of an edge of the patterned photoresist, the slope of sidewalls of the photoresist, the thickness of the photoresist, and the direction of ion implantation, ions may, or may not, be implanted into the entirety of the surface portion of the first semiconductor region by shading or non-shading of the first semiconductor region. The semiconductor substrate may further comprise a third semiconductor region into which the dopants are implanted irrespective of the shading or non-shading of the first semiconductor region. The selection of shading or non-shading may be changed from substrate to substrate in manufacturing.

20 Claims, 8 Drawing Sheets

METHOD OF SELECTIVELY ADJUSTING ION IMPLANTATION DOSE ON SEMICONDUCTOR DEVICES

BACKGROUND OF THE INVENTION

The present invention relates to a method of forming a semiconductor structure, and particularly to a method of employing a photoresist profile, direction of ion implantation, and arrangement of semiconductor regions in a semiconductor substrate to enable adjustment of ion implantation dose across multiple semiconductor regions with a single ion implantation mask.

There are many instances in semiconductor chips in which transistor matching is of paramount importance; that is, two identically designed transistors are to perform identically to one another. One such instance is in a six-transistor static random access memory (6TSRAM) cell. In this cell there are two halves to the cell (called here left and right), each side consisting of three transistors. Cell functionality is optimum when the three transistors in the left half match exactly (in threshold voltage and drive current, for example) their corresponding transistor in the right half. As there is often a large number of such cells in a design, the area consumed for such a cell is of great importance also, and the cell is to be made as small as possible. The small spacings employed therein poses additional challenges to transistor matching.

In view of the above, there exists a need for a method of manufacturing a semiconductor structure in which tightly packed transistors match as identically as possible.

Typically, an ion implantation mask enables two different dopant profiles, one formed underneath an area covered with a photoresist and protected from implantation of ions and another formed outside the area covered with the photoresist and implanted with ions. However, transistors located in close proximity to the mask edge may experience partial blockage of the implanted ions, and this partial blockage can vary with mask alignment.

Therefore there exists a need for a method of manufacturing a semiconductor structure in which the ion implantation is not sensitive to the mask placement over normal process variations, and yet small spacing is employed.

BRIEF SUMMARY OF THE INVENTION

The present invention addresses the needs described above by providing a method of selectively preventing or allowing implantation of ions into a semiconductor region located adjacent to another semiconductor region that is protected from the implantation of ions by adjusting location of an edge of a patterned photoresist, the slope of sidewalls of the photoresist, the thickness of the photoresist, and the direction of ion implantation.

According to the present invention, a first semiconductor region and a second semiconductor region separated by a shallow trench isolation region are formed in a semiconductor substrate. A photoresist is applied and patterned so that the first semiconductor region is exposed, while the second semiconductor region is covered. Depending on the setting of parameters for the location of an edge of the patterned photoresist, the slope of sidewalls of the photoresist, the thickness of the photoresist, and the direction of ion implantation, ions may, or may not, be implanted into the entirety of the surface portion of the first semiconductor region by shading or non-shading of the first semiconductor region. The semiconductor substrate may further comprise a third semiconductor region into which the dopants are implanted irrespective of the shading or non-shading of the first semiconductor region. The selection of shading or non-shading may be changed from substrate to substrate in manufacturing.

According to an aspect of the present invention, a method of implanting ions into a semiconductor substrate is provided, which comprises:

providing a semiconductor substrate including a first semiconductor region and a second semiconductor region separated from each other by a first shallow trench isolation (STI) region;

forming a patterned photoresist covering the second semiconductor region and not covering any of the first semiconductor region; and implanting ions into the semiconductor substrate, wherein an entirety of the first semiconductor region and an entirety of the second semiconductor region are shielded from the ions by the patterned photoresist.

In one embodiment, the method further comprises implanting additional ions into the semiconductor substrate with the patterned photoresist on the semiconductor substrate, wherein an entirety of the first semiconductor region is shielded from the additional ions by the patterned photoresist, and wherein the additional ions are implanted to an entirety of a surface portion of the second semiconductor region.

According to another aspect of the present invention, another method of implanting ions into a semiconductor substrate is provided, which comprises:

providing a first semiconductor substrate including a first semiconductor region and a second semiconductor region separated from each other by a first shallow trench isolation (STI) region;

applying a first photoresist and patterning the first photoresist with a first pattern employing a lithographic mask, wherein the patterned first photoresist covers the second semiconductor region and does not cover any of the first semiconductor region;

implanting first ions into the first semiconductor substrate, wherein an entirety of the first semiconductor region and an entirety of the second semiconductor region are shielded from the first ions by the first patterned photoresist;

providing a second semiconductor substrate including a third semiconductor region and a fourth semiconductor region separated from each other by a second shallow trench isolation (STI) region;

applying a second photoresist and patterning the second photoresist with a second pattern employing the lithographic mask, wherein the patterned second photoresist covers the fourth semiconductor region and does not cover any of the third semiconductor region; and implanting second ions into the second semiconductor substrate, wherein an entirety of the third semiconductor region is shielded from the second ions by the second patterned photoresist, and wherein the second ions are implanted to an entirety of a surface portion of the fourth semiconductor region.

According to yet another aspect of the present invention, yet another method of implanting ions into a semiconductor substrate is provided, which comprises:

providing a semiconductor substrate including a first semiconductor region, a second semiconductor region, and a third semiconductor region, wherein the second semiconductor region is separated from the first semiconductor region by a first shallow trench isolation (STI) region and the third semiconductor region is separated from the first semiconductor region by a second shallow trench isolation (STI) region;

forming a patterned photoresist covering the second semiconductor region and not covering any of the first semiconductor region or the third semiconductor region; and implanting ions into the semiconductor substrate, wherein an entirety of the first semiconductor region and an entirety of the second semiconductor region are shielded from the ions by the patterned photoresist, and wherein the ions are implanted to an entirety of a surface portion of the third semiconductor region.

In one embodiment, the method further comprises implanting additional ions into the first semiconductor substrate with the patterned photoresist on the semiconductor substrate, wherein an entirety of the first semiconductor region is shielded from the additional ions by the patterned photoresist, and wherein the additional ions are implanted to an entirety of a surface portion of the second semiconductor region and to an entirety of a surface portion of the third semiconductor region.

BRIEF DESCRIPTION OF THE DRAWINGS

FIG. 1A is a top-down view of the exemplary semiconductor structure. FIG. 1B is a vertical cross-sectional view of the exemplary semiconductor structure along the plane B-B'. FIG. 1C is a vertical cross-sectional view of the exemplary semiconductor structure along the plane C-C'.

DETAILED DESCRIPTION OF THE INVENTION

Figure 1A:
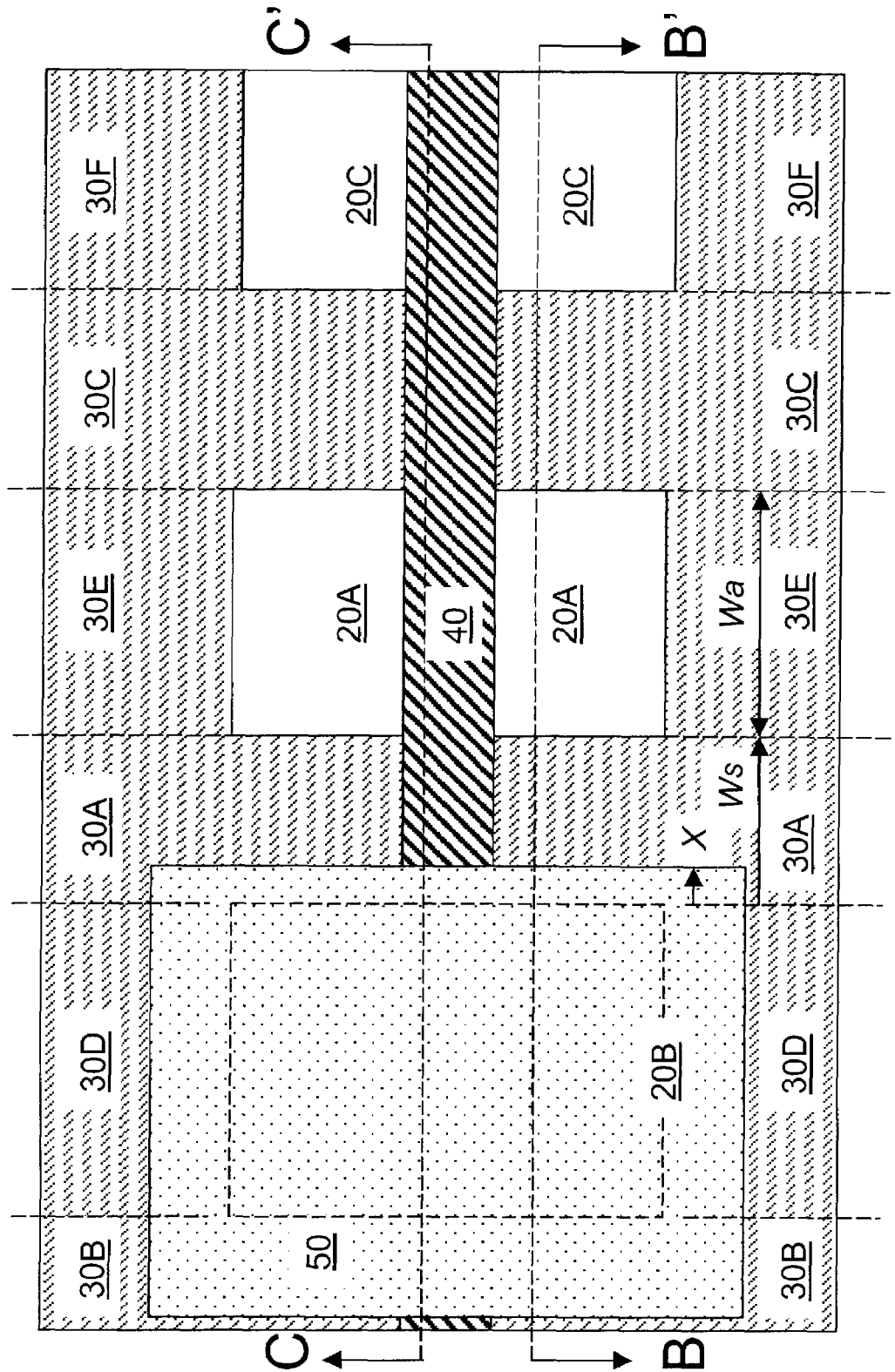
FIGS. 1A, 1B, and 1C are views of an exemplary semiconductor structure according to the present invention at an ion implantation step.

As stated above, the present invention relates to a method of employing a photoresist profile, direction of ion implantation, and arrangement of semiconductor regions in a semiconductor substrate to enable adjustment of ion implantation dose across multiple semiconductor regions with a single ion implantation mask. It is noted that like reference numerals refer to like elements.

Figure 1B:
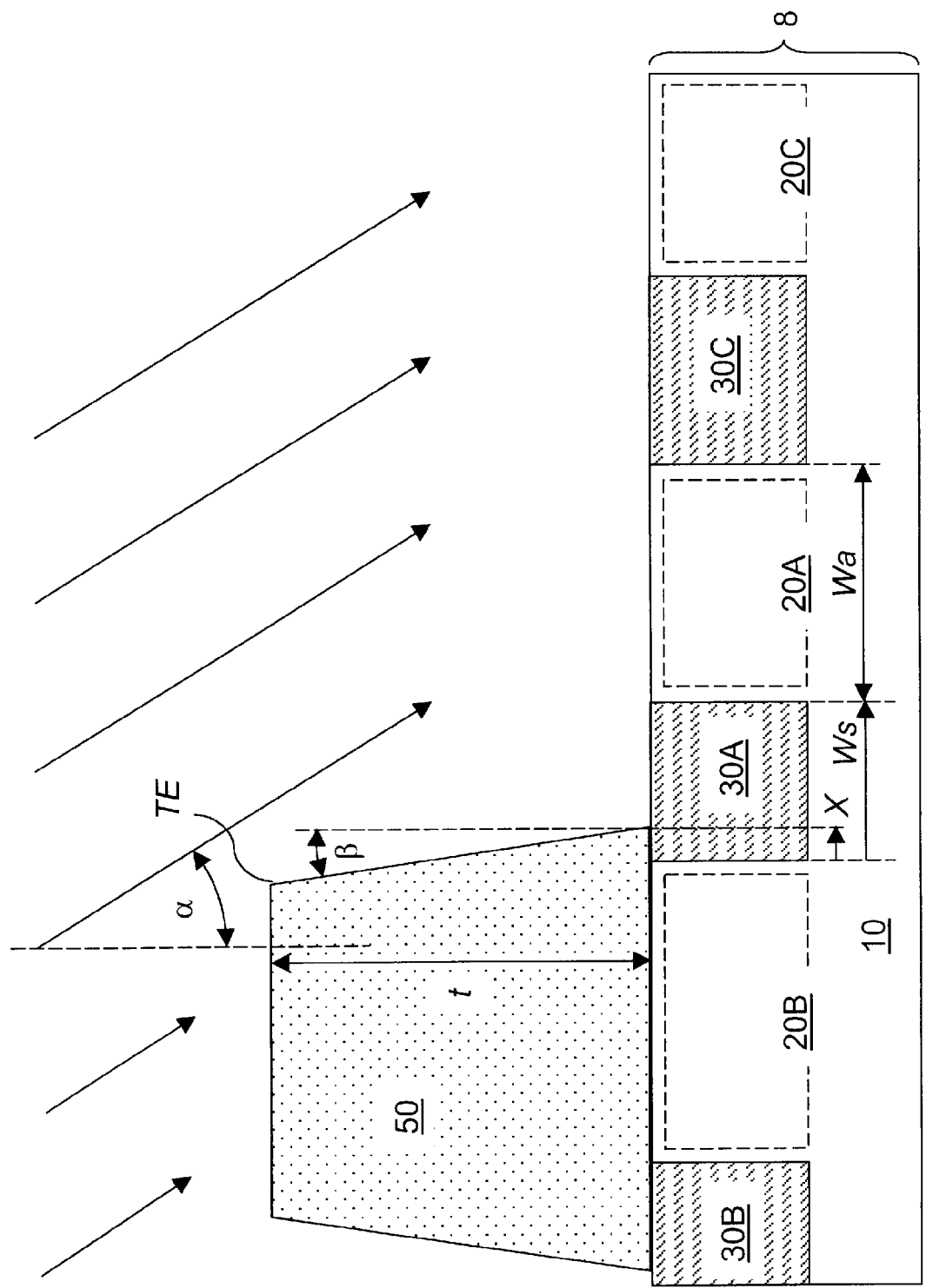
Figure 1C:
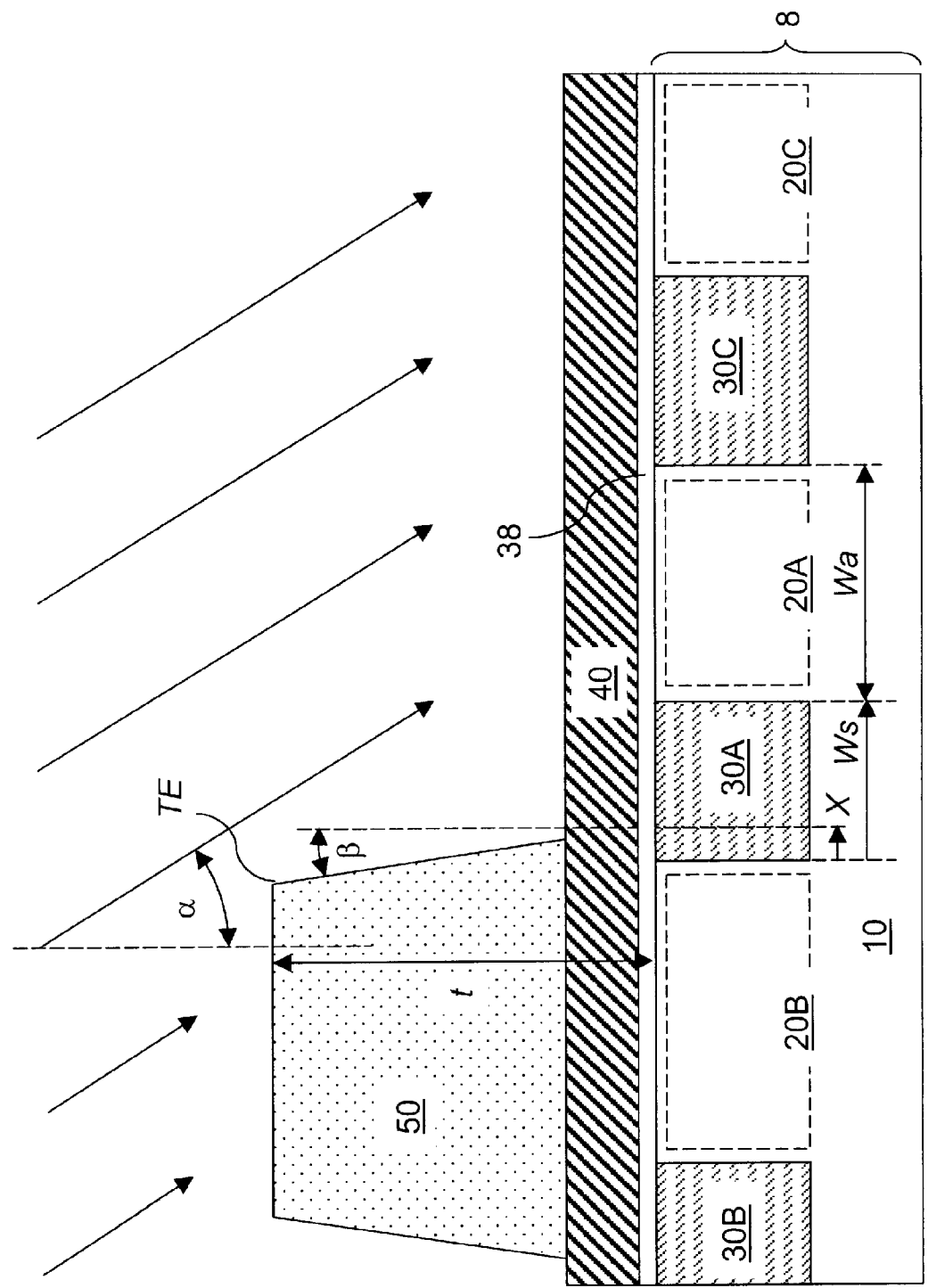

Referring to FIGS. 1A-1C, an exemplary semiconductor structure according to the present invention comprises a semiconductor substrate 8 containing a semiconductor layer 10 and various shallow trench isolation regions. FIG. 1A is a top-down view; FIG. 1B is a vertical cross-sectional view along the plane B-B'; and FIG. 1C is another vertical cross-sectional view along the plane C-C'.

Preferably, the semiconductor layer 10 comprises a semiconductor material. The semiconductor material may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Typically, the semiconductor material comprises silicon. Preferably, the semiconductor substrate 8 is a single crystalline substrate in which the entirety of the semiconductor layer 10 is epitaxially aligned single crystalline material. The semiconductor substrate 8 may be a bulk substrate, a semiconductor-on-insulator (SOI) substrate, or a hybrid substrate including a bulk portion and an SOI portion. The semiconductor substrate 8 may have a built-in stress in the semiconductor layer 10. While the present invention is described with a bulk substrate, implementation of the present invention on an SOI substrate or a hybrid substrate is explicitly contemplated herein.

The semiconductor layer 10 includes a first semiconductor region 20A, a second semiconductor region 20B, and a third semiconductor region 20C. Each of the first semiconductor region 20A, the second semiconductor region 20B, and the third semiconductor region 20C has a surface portion, which constitute a part of the top surface of the semiconductor substrate 8. The top surfaces of the first through third semiconductor regions (20A-20C) are coplanar among one another. Each of the first through third semiconductor regions (20A-20C) is separated from the rest by the various shallow trench isolation regions. Each of the first through third semiconductor regions (20A-20C) may be laterally surrounded by the various shallow trench isolation regions.

The various shallow trench isolation regions may, or may not, be of contiguous construction. Typically, the various shallow trench isolation regions are of contiguous construction. In the exemplary semiconductor structure, the first semiconductor region 20A is separated from the second semiconductor region by a first shallow trench isolation (STI) region 30A. A second shallow trench isolation region 30B is located on the side of the second semiconductor region 20B which is the opposite of the side laterally abutting the first STI region 30A. A third shallow trench isolation region 30C is located between the first semiconductor region 20A and the third semiconductor region 20C.

For the purposes of description of the present invention, a Cartesian coordinate system is employed to describe locations of various elements of the exemplary semiconductor structure. The horizontal axis within the plane B-B' constitutes an x-axis. The x-coordinate increases from left to right in FIGS. 1B and 1C. The zero point of the x-coordinate coincides with the interface between the second semiconductor region 20B and the first STI region 30A. The horizontal axis perpendicular to the plane B-B' constitutes a y-axis. The vertical axis, which is parallel to a surface normal of the top surface of the semiconductor substrate 8, constitutes a z-axis.

The first STI region 30A has a width in the x-axis direction, which is herein referred to as a shallow trench isolation width Ws. The value of the x-coordinate for the points in the first STI region 30A is from 0 to the semiconductor region width Ws. The first semiconductor region 20A has a width in the x-axis direction, which is herein referred to as a semiconductor region width Wa. The value of the x-coordinate for the points in the first semiconductor region 20A is from Ws to the semiconductor region width Ws+Wa. The second semiconductor region 20B has a width in the x-direction. The value of the x-coordinate for the points in the second STI region 30B is from 0 to a negative value, which has the same magnitude as the width of the second semiconductor region 20B in the x-axis direction. Likewise, each of the third semiconductor region 20C, the second STI region 30B, and the third STI region 30C has a range of values that are limited by the geometry of the exemplary semiconductor structure, and specifically by the widths of each structure and the widths of other structures between the origin of the x-axis and the structure of concern.

The portion of the various shallow trench isolation structures comprising points having the range for the x-coordinate as the second semiconductor region 20B is herein referred to as a fourth STI region 30D. The portion of the various shallow trench isolation structures comprising points having the range for the x-coordinate as the first semiconductor region 20A is herein referred to as a fifth STI region 30E. The portion of the various shallow trench isolation structure comprising points having the range for the x-coordinate as the third semiconductor region 20C is herein referred to as a fifth STI region 30E. The second STI region 30B laterally abuts the fourth STI region 30D; the fourth STI region 30D laterally abuts the first STI region 30A; the first STI region 30A laterally abuts the fifth STI region 30E; the fifth STI region 30E laterally abuts the third STI region 30C; and the third STI region 30C laterally abuts the sixth STI region 30F. The various shallow trench isolation regions (30A-30E) may be of integral construction, and may have a substantially the same depth throughout from the top surface of the semiconductor substrate 8.

The various shallow trench isolation regions (30A-30E) may be formed by methods known in the art. For example, shallow trenches having a depth less than 800 nm, and typically less than 500 nm, are formed in the semiconductor layer 10 employing at least one pad layer (not shown). A dielectric material is deposited in the shallow trenches. For example, the dielectric material may comprise a chemical vapor deposition (CVD) silicon oxide that may be deposited by plasma enhanced chemical vapor deposition (PECVD), high density plasma chemical vapor deposition (HDPCVD), low pressure chemical vapor deposition (LPCVD), or rapid thermal chemical vapor deposition (RTCVD). The dielectric material may, or may not, comprise a liner material such as silicon nitride or silicon oxynitride. Preferably, the dielectric material comprises an undoped silicate glass (USG) deposited by high density plasma chemical vapor deposition (HDPCVD). The dielectric material is subsequently planarized, for example, by chemical mechanical planarization (CMP), a recess etch, or a combination thereof. The dielectric material is recessed to a level that is substantially coplanar with the top surface of the semiconductor substrate 8. The remaining portions of the dielectric material after recess constitute the various shallow trench isolation regions (30A-30E).

A gate dielectric 38 and a gate conductor line 40 may be formed by deposition of a gate dielectric layer and a gate conductor layer, followed by lithographic patterning of the gate dielectric layer and the gate conductor layer. The remaining portion of the gate dielectric layer after the patterning constitutes the gate dielectric 30, and the remaining portion of the gate conductor line 40 after the patterning constitutes the gate conductor line 40. The gate conductor line may, or may not run across any of the two adjacent regions, e.g., across the first semiconductor region 20A and the first STI region 30A. Each of the first through third semiconductor regions (20A-20C) is intended as an active area for forming semiconductor devices thereupon. For illustrative purposes, therefore, the gate conductor line 40 runs across the first through third semiconductor regions (20A-20C) and the first through third STI regions (30A-30C). Variations of the exemplary semiconductor structure in which the gate conductor line 40 runs across does not run across at least one of the boundaries between adjacent regions are explicitly contemplated herein. Further, variations in which multiple gate conductor lines 40 are formed on a semiconductor structure are also explicitly contemplated herein.

According to an aspect of the present invention, the first semiconductor region 20A, the second semiconductor region 20B, and the third semiconductor region 20C may have three different dopant profiles employing a single lithographic mask and a single patterned photoresist. Specifically, a photoresist 50 is applied over the semiconductor substrate 8 and is lithographically patterned to cover the entirety of the second semiconductor region 20B, while exposing the entirety of the first semiconductor region 20A and the entirety of the third semiconductor region 20C.

A lithographic mask (now shown) is employed to pattern the photoresist 50. The lithographic mask is mounted onto a lithography tool, which transfers the pattern in the lithographic mask onto a photoresist 50 so that the irradiated portions of the photoresist 50 are exposed. The lithographic mask may be a block level mask and the photoresist 50 may be a mid-ultraviolet (MUV) photoresist which is exposed by mid-ultraviolet (MUV) radiation. Alternately, the lithographic mask may be a deep-ultraviolet (DUV) mask and the photoresist 50 may be a deep-ultraviolet (DUV) photoresist which is exposed by deep-ultraviolet (MUV) radiation.

The photoresist 50 has a thickness t as measured from a top surface of the semiconductor substrate 8. Since the photoresist 50 is typically planarizing, the height of the top surface of the photoresist over the gate conductor line 40 is typically separated from the top surface of the semiconductor substrate 8 by the thickness t. The range of the thickness t of the photoresist 50 may be from about 50 nm to 1,000 nm, and typically from about 100 nm to about 700 nm, although lesser and greater thickness are also contemplated herein.

The exposure and patterning of the photoresist 50 leaves a patterned portion of the photoresist 50 over the second semiconductor region 20B. After development, therefore, the photoresist 50 has sidewalls, one of which has an edge adjoining a top surface of the first STI region 23A. The photoresist 50 extends over the first STI region 30A from the interface of the first STI region 30A with the second semiconductor region 20B by the overlap distance X, which is also the x-coordinate of the bottom of the sidewall of the photoresist 50 over the first STI region 30A. In other words, the overlap distance X is the width of the overlap of the photoresist 50 after patterning with the first STI region in the direction of the x-axis.

The exposure conditions are adjusted so that the sidewalls of the photoresist 50 has a slope angle β as measured from the direction of the z-axis, i.e., from a surface normal of the semiconductor substrate 8. The range of the slope angle β may be from 0 to 45 degrees, and typically from 0 to about 25 degrees. Depth of focus and/or diffuseness of the exposure may be employed to tune the slope angle slope angle β0 of the sidewalls of the photoresist 50 after development. The x-coordinate of the top edge TE of the sidewall of the photoresist 50 on the side of the first STI region 30A has an x-coordinate of X−t×tan(β) since the lateral offset in the x-direction between the bottom edge of the sidewall of the photoresist 50 abutting the first STI region 30A and the top edge TE of the sidewall of the photoresist 50 on the side of the first STI region 30A is t x tan (β).

Ions are implanted by ion implantation into the semiconductor substrate 8 employing the photoresist 50 as an implant mask with a tilt angle α. The ions may comprise electrical dopants or non-electrical dopants. The electrical dopants may be at least one p-type dopant such as B, Ga, and In. Alternately, the electrical dopants may be at least one n-type dopant such as P, As, and Sb. A combination of p-type dopants and n-type dopants may be implanted. The non-electrical dopants may be one of C, Ge, H, O, N, He, Ne, Ar and Kr.

The direction of the ion beam, which may contain a single ion specie or a combination of multiple ion species, may, or may not, be confined in an x-z plane with a constant y-coordinate such as the plane B-B' or the plane C-C'. In other words, the unit vector representing the direction of the implanted ions may, or may not, have a non-zero y-component. While the present invention is described for an ion implantation direction confined within an x-z plane, i.e., with a zero y-component in the unit vector representing the direction of the implanted ions, variations of the present invention in which the unit vector has a non-zero y-component are also explicitly contemplated herein.

The unit vector contains a downward vertical component and a horizontal component pointing from the direction of the second semiconductor region 20B to the first semiconductor region 20A. In other words, the z-component of the unit vector representing the direction of the ion implantation is negative, and the x-component of the unit vector is positive. Specifically, the value of the z-component of the unit vector is—cosine (α) and the x-component of the unit vector is sine (α).

The energy of the ions implanted into the semiconductor substrate may be low, i.e., in the range from about 1 keV to about 20 keV, or may be high, i.e., above 20 keV. In the case of low energy ion implantation, the ions are stopped even by a thin material portion located in the path of the ion beam. Thus, the portion of the top surface of the semiconductor substrate 8 having a y-coordinate within the range of the y-coordinate of the top edge TE of the sidewall of the photoresist 50 and having an x-coordinate less than the sum of t×tan(α) and the x-coordinate of the top edge TE of the sidewall of the photoresist 50, i.e., having an x-coordinate less than t×tan(α)+X−t×tan(β) is completely shielded from the ion implantation. The portion of the top surface of the semiconductor substrate 8 having an x-coordinate greater than t×tan(α)+X−t×tan(β) is exposed to the impinging ions during the ion implantation processing step.

Depending on the selection of parameters of the present invention, the first semiconductor region 20A may, or may not be subjected to the impinging ions of the ion implantation processing step. The parameters of the present invention that affects whether the first semiconductor region is shielded or not shielded from the ions by the photoresist 50 include the thickness t of the photoresist 50, the overlap distance X between the first semiconductor region 20A and the photoresist 50, the tilt angle α of the ion implantation, and the slope angle β of the sidewalls of the photoresist 50.

An edge of the implanted area affected by the shadowing of ions due to the photoresist 50 is located at the x-coordinate of X+t×tan(α)−t×tan(β). If the x-coordinate of X+t×tan(α)−t×tan(β) is greater than Ws+Wa, the entirety of the first semiconductor region 20A may be shielded by the photoresist 50. If the x-coordinate of X+t×tan(α)−t×tan(β) is less than Ws, the entirety of the first semiconductor region 20A is exposed to the impinging ions in the ion beam. If the x-coordinate of X+t×tan(α)−t×tan(β) is less than Ws+Wa and greater than Ws, a portion of the first semiconductor region 20A shielded from the ions in the ion beam, while the rest of the first semiconductor region 20A is exposed to the impinging ions in the ion beam. In other words, partial implantation of the first semiconductor region 20A results when the x-coordinate of X+t×tan(α)−t×tan(β) is less than Ws+Wa and greater than Ws.

Each of the above cases may be advantageously employed to control the dopant profile in the first semiconductor region 20A. In one preferred embodiment, the entirety of the first semiconductor region 20A is shielded from the implanted ions so that no ions are implanted into any portion the first semiconductor region 20A. In another preferred embodiment, the entirety of the first semiconductor region 20A is exposed to the implanted ions so that the entirety of a top portion of the first semiconductor region extending from the first STI region 30A to the third STI region 30C is implanted with ions.

Figure 2:
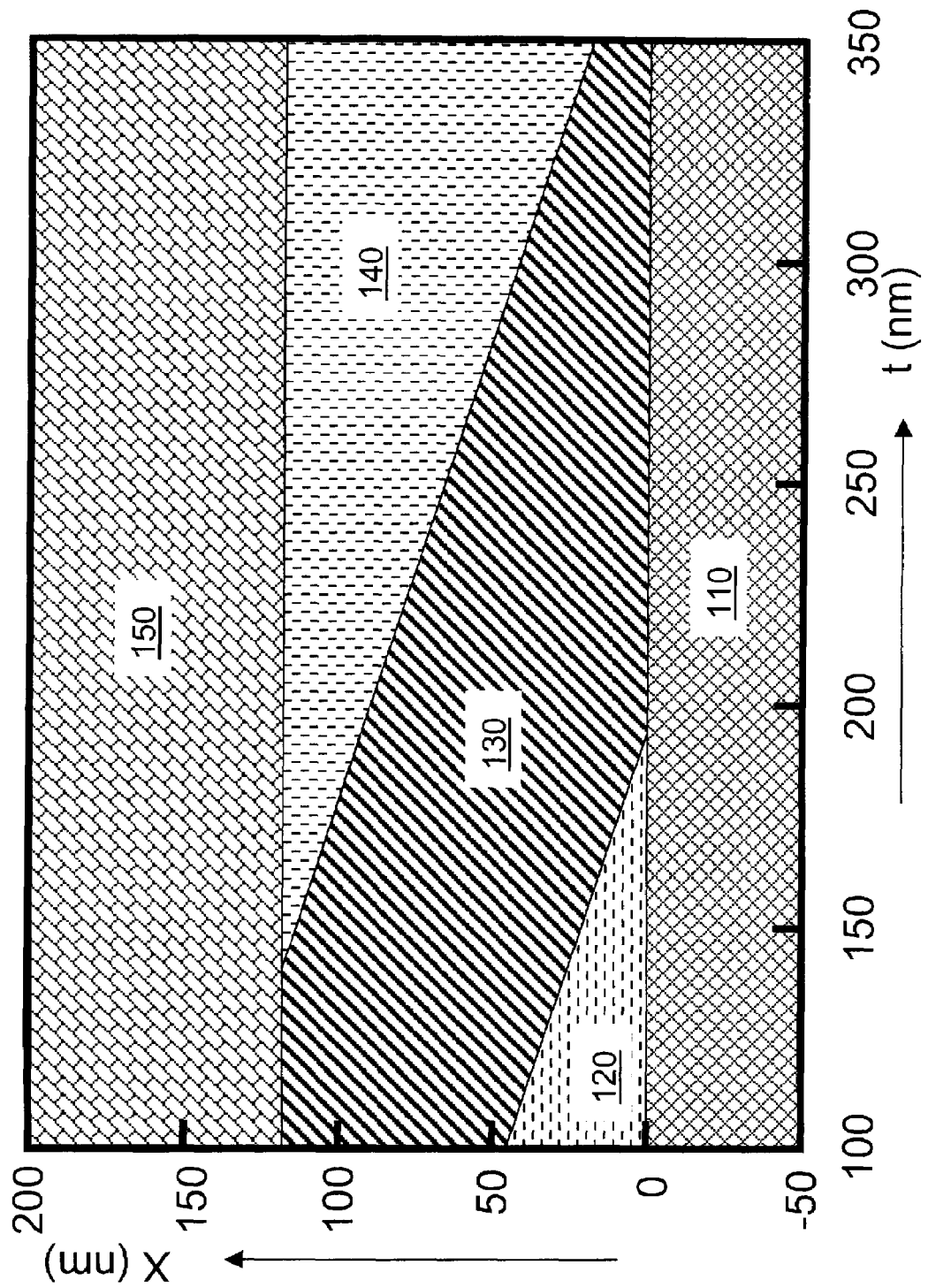
FIG. 2 is a process window diagram showing parameter ranges for complete shadowing of implantation ions and for complete exposure to implant ions as a function of the thickness t of a photoresist and the overlap distance X from an edge of a second semiconductor region at a resist sidewall slope angle $\beta$ of 10 degree, at an ion implantation tilt angle $\alpha$ of 37 degrees, at a semiconductor region width Wa of 100 nm, and at a shallow trench isolation width Ws of 120 nm.

FIG. 2 is a process window diagram as a function of the thickness t of the photoresist 50 and the overlap distance X from an edge of a second semiconductor region 20B. The resist sidewall slope angle β is fixed at 10 degree, the ion implantation tilt angle α is fixed at 37 degrees, the semiconductor region width Wa is fixed at 100 nm, and the shallow trench isolation width Ws is fixed at 120 nm in this process window diagram. Parameter ranges for the thickness t of the photoresist 50 and the overlap distance X are shown for a non-shadowing process window 120, which satisfies the condition X+t×tan(α)−t×tan(β)<Ws. Parameter ranges for the thickness t of the photoresist 50 and the overlap distance X are shown for a partial shadowing process window 130, which satisfies the condition Ws<X+t×tan(α)−t×tan(β)<Ws+Wa. Parameter ranges for the thickness t of the photoresist 50 and the overlap distance X are also shown for a complete shadowing process window 140, which satisfies the condition Ws+Wa<X+t×tan(α)−t×tan(β). Preferably, the entirety of the third semiconductor region 20C is implanted with the ions.

If the overlap distance X is negative, the second semiconductor region 20B is partly exposed to the impinging ions in the ion beam. In other words, this condition allows introduction of ions into the second semiconductor region 20B, which is not desired. The range of process conditions producing such a result is shown as an incomplete blocking process window 110. If the overlap distance X exceeds the shallow trench isolation width Ws, the first semiconductor region 20A is partly covered by the photoresist 50, which makes it impossible to the implant ions to the entirety of the first semiconductor region 20A. The range of process conditions producing such a result is shown as a over-blocking process window 150.

Figure 3:
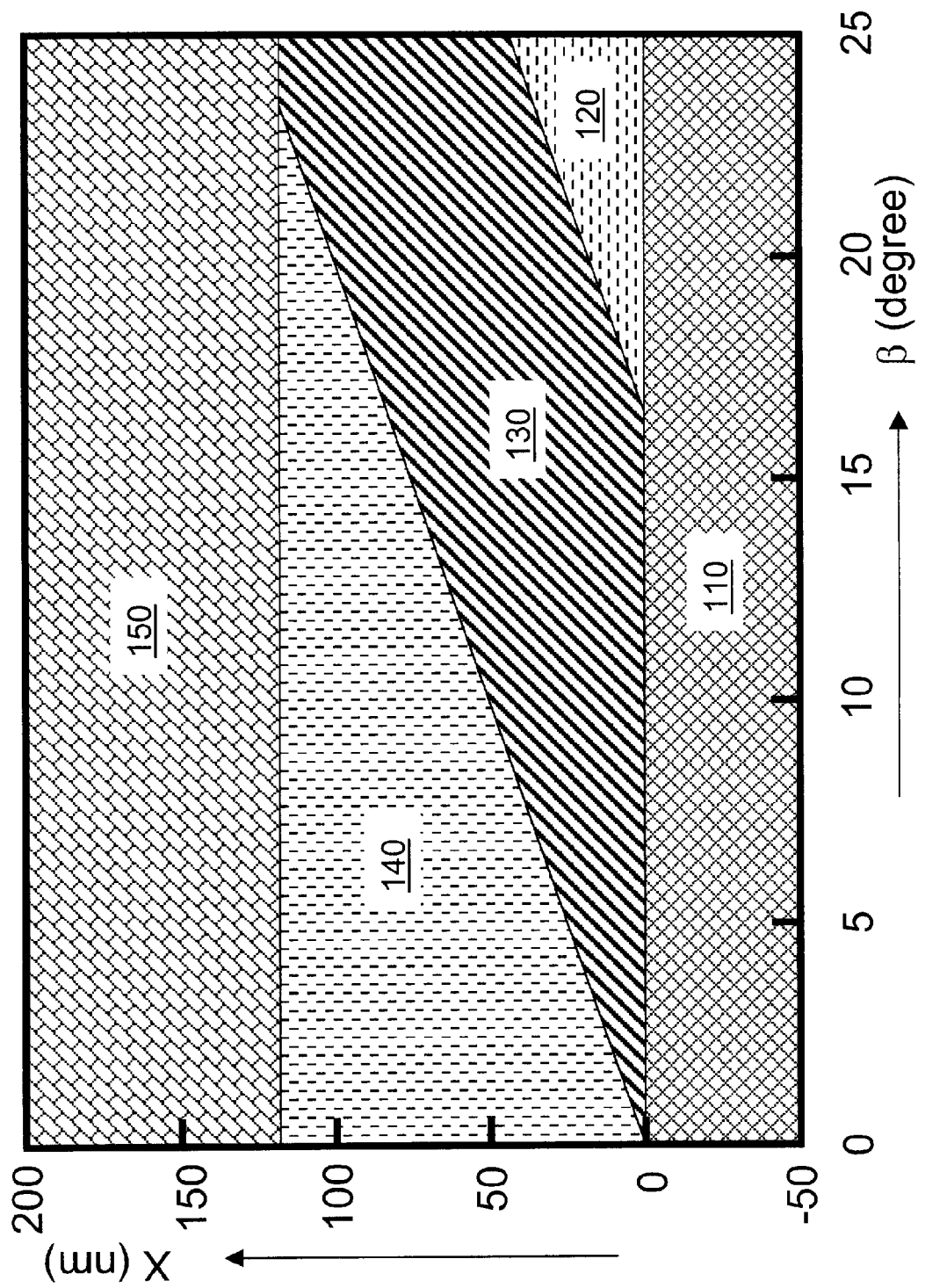
FIG. 3 is a process window diagram showing parameter ranges for complete shadowing of implantation ions and for complete exposure to implant ions as a function of the resist sidewall slope angle $\beta$ and the overlap distance X from an edge of a second semiconductor region at the thickness t of the photoresist of 300 nm, at the ion implantation tilt angle $\alpha$ of 37 degrees, at the semiconductor region width Wa of 100 nm, and at the shallow trench isolation width Ws of 120 nm.

FIG. 3 is a process window diagram as a function of the resist sidewall slope angle β of the photoresist 50 and the overlap distance X from an edge of a second semiconductor region 20B. The thickness t of the photoresist 50 is fixed at 300 nm, the ion implantation tilt angle α is fixed at 37 degrees, the semiconductor region width Wa is fixed at 100 nm, and the shallow trench isolation width Ws is fixed at 120 nm in this process window diagram. The formula for determining the parameter ranges for the non-shadowing process window 120, the partial shadowing process window 130, and the complete shadowing process window 140 are the same as described above. Preferably, the entirety of the third semiconductor region 20C is implanted with the ions.

Figure 4:
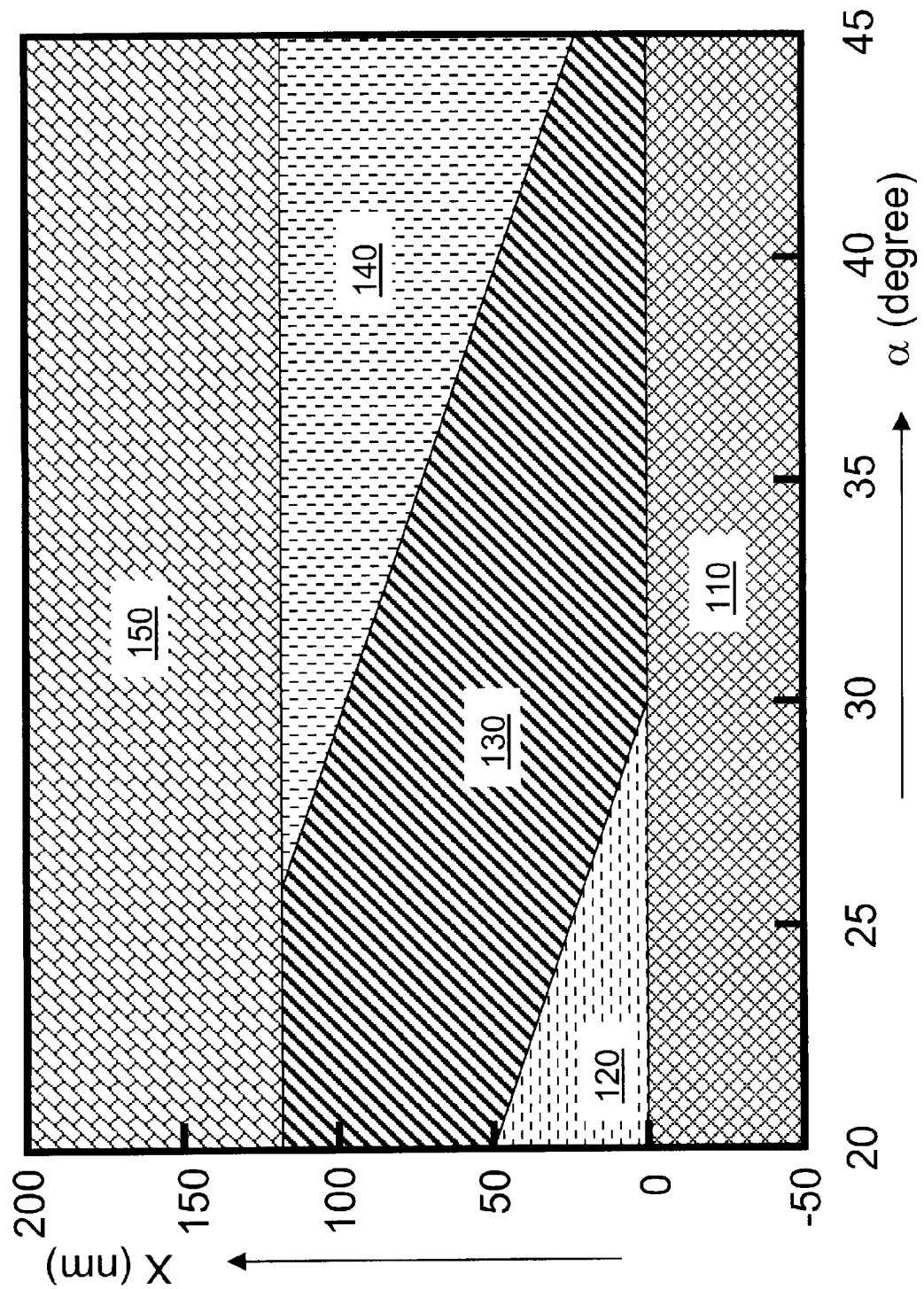
FIG. 4 is a process window diagram showing parameter ranges for complete shadowing of implantation ions and for complete exposure to implant ions as a function of the ion implantation tilt angle $\alpha$ and the overlap distance X from an edge of a second semiconductor region at the thickness t of the photoresist of 300 nm, at the resist sidewall slope angle $\beta$ of 10 degrees, at the semiconductor region width Wa of 100 nm, and at the shallow trench isolation width Ws of 120 nm.

FIG. 4 is a process window diagram as a function of the ion implantation tilt angle α and the overlap distance X from an edge of a second semiconductor region 20B. The thickness t of the photoresist 50 is fixed at 300 nm, the resist sidewall slope angle β is fixed at 10 degrees, the semiconductor region width Wa is fixed at 100 nm, and the shallow trench isolation width Ws is fixed at 120 nm in this process window diagram. The formula for determining the parameter ranges for the non-shadowing process window 120, the partial shadowing process window 130, and the complete shadowing process window 140 are the same as described above. Preferably, the entirety of the third semiconductor region 20C is implanted with the ions.

Figure 5:
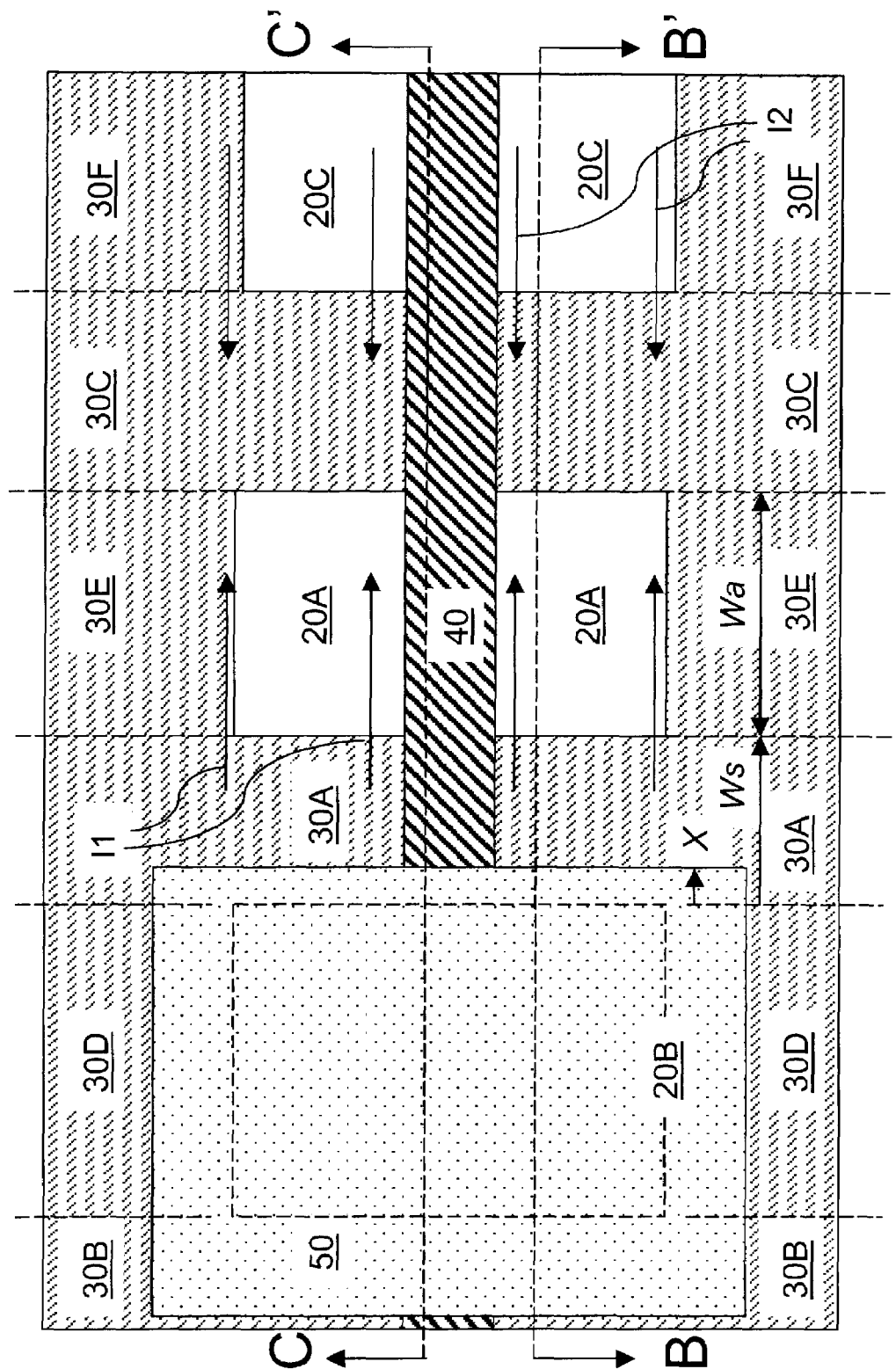
FIG. 5 is a top-down views of the exemplary semiconductor structure according to the present invention during two rounds of ion implantation illustrating the first direction I1 of a first ion implantation and a second direction I2 of a second ion implantation.

Referring to FIG. 5, additional ion implantation may be performed prior to the ion implantation step described above, which is herein referred to a first round of ion implantation, or after the ion implantation step described above. The step of the additional ion implantation is herein referred to a second round of ion implantation. The direction of ions in the ion beam in the first round of ion implantation is herein referred to as a first direction. The direction of ions in the ion beam in the second round of ion implantation is herein referred to as a second direction. The first direction and the second direction are different. The unit vector representing the second direction, which is herein referred to as a second unit vector, has a negative z-component. The unit vector representing the first direction is herein referred to as a first unit vector. The x-component of the second unit vector may be positive or negative. The y-component of the second unit vector may be zero or non-zero.

The second direction is selected such that the entirety of the first semiconductor region 20A and the entirety of the third semiconductor region 20C are implanted by the ions during the second round of ion implantation. No dopants are introduced into the second semiconductor region 20B during the combined period of the first and second rounds of ion implantation. The top portion of the first semiconductor region 20A has a first dopant concentration, which is equal to the dose of the first round of ion implantation. The top portion of the third semiconductor region 20C has a second dopant concentration, which is equal to the dose of the first round of ion implantation and the dose of the second round of ion implantation. The ion specie of the second ion implantation may be the same as, or different from, the ion specie of the first ion implantation. Thus, the exemplary semiconductor structure comprises three distinct semiconductor regions, each having a different dopant profile from the other two semiconductor regions.

In general, a plurality of instances of each type of semiconductor regions may be formed in a semiconductor structure to provide three types of active areas having different dopant profile. Ions may be implanted prior to patterning of the photoresist 50, or after removal of the photoresist 50 into the semiconductor substrate 8 so that each of the first through third semiconductor regions (20A-20C) is implanted uniformly. The uniform dopant profile may be superposed to the three different dopant profiles described above. The uniform dopant profile only shifts the overall doping level, and does not remove the difference among the dopant profiles in the various semiconductor regions (20A-20C).

In one embodiment of the present invention, the first unit vector and the second unit vector have the same z-component, and have zero y-component, and have opposite x-components. The magnitude of the first tilt angle $α_1$ (not shown), which is the tilt angle of the first round of ion implantation, and the magnitude of second tilt angle $α_2$ (not shown), which is the tilt angle of the second round of ion implantation, are the same. However, the direction of the first tilt angle $α_1$ and the second tilt angle $α_2$ are opposite. The ion specie and/or the dose of the second round of ion implantation may be the same as, or different from, the ion specie and/or the dose of the first round of ion implantation. If the ion specie of the second round of ion implantation is the same as the ion specie of the first round of ion implantation and the dose of the second round of ion implantation is also the same as the dose of the first round of ion implantation, the first round and the second round of ion implantation may be performed consecutively by azimuthally rotating the semiconductor substrate 8 by 180 degrees about the surface normal of the semiconductor substrate 8.

Figure 6:
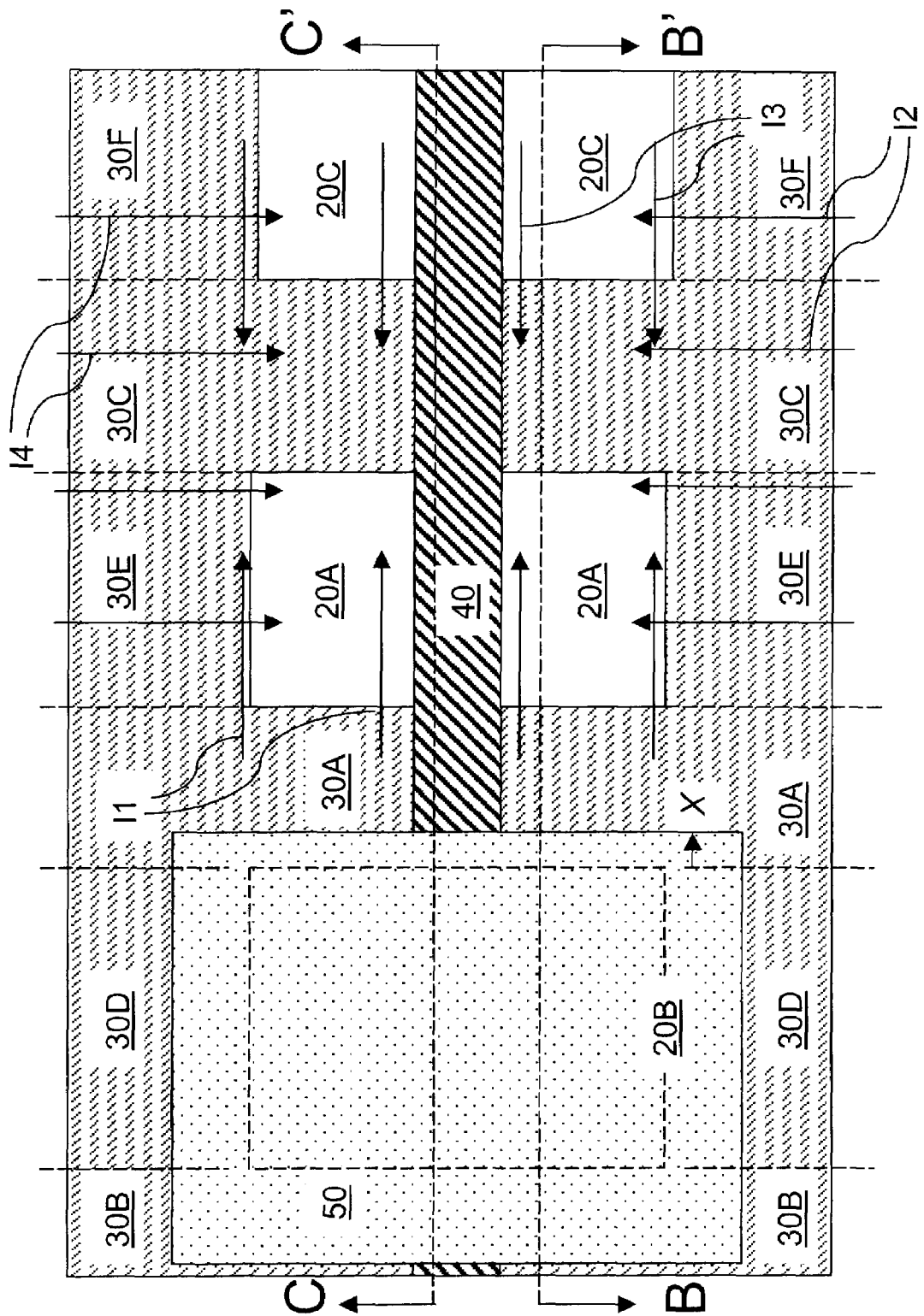
FIG. 6 is a top-down views of the exemplary semiconductor structure according to the present invention during a quad ion implantation illustrating the first direction I1 of a first ion implantation, a second direction I2 of a second ion implantation, a third direction of a third ion implantation I3, and a fourth direction of a fourth ion implantation.

Referring to FIG. 6, a quad implantation, which comprises four rounds of ion implantation, may be performed into the semiconductor substrate 8. The first round of ion implantation and the second round of ion implantation described above in reference to FIG. 5 may be two of the four rounds of the a quad implantation. In the quad implantation, the four rounds of ion implantation are performed with a 90 degree azimuthal rotation of the semiconductor substrate 8 around the surface normal of the semiconductor substrate 8 between each pair of consecutive rounds, i.e., between the round 1 and round 2, between round 2 and round 3, and between round 3 and round 4. The first round of ion implantation described above may correspond to round 1 and the second round of ion implantation described may correspond to round 3, or vice versa. Alternately, the first round of ion implantation described above may correspond to round 2 and the second round of ion implantation described may correspond to round 4, or vice versa. The tilt angle, the ion specie, and the dose are the same across the four rounds of the quad implantation.

According to another aspect of the present invention, the dopant profile of the first semiconductor region 20A may be changed from substrate to substrate without altering dopant profiles of the second semiconductor region 20B and the third semiconductor region 20C. This feature of the present invention may be advantageously employed in semiconductor manufacturing so that a first batch of semiconductor substrates is manufactured with dopants implanted into the first semiconductor region 20A during ion implantation with the photoresist 50 on the semiconductor substrate 8, while a second batch of semiconductor substrates is manufactured without implanting dopants into the first semiconductor region 20A during ion implantation with the photoresist 50 on the semiconductor substrate 8. The ion implantation implants dopants into the third semiconductor region 20C and does not implant any dopant into the second semiconductor region 20C in both batches of semiconductor substrates.

It is noteworthy that two different types of semiconductor substrates, one having dopants introduced into the first and third semiconductor regions (20A, 20C) by an ion implantation step and the other having dopants introduced only into the third semiconductor region 20C and not into the first semiconductor region 20A, are manufactured employing the same lithographic mask. The present invention allows such flexibility by manipulating the parameters involved in masked ion implantation, i.e., the thickness t of the photoresist 50, the overlap distance X between the first semiconductor region 20A and the photoresist 50, the tilt angel a of the ion implantation, and the slope angle β of the sidewalls of the photoresist 50.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of implanting ions into a semiconductor substrate comprising:
    providing a semiconductor substrate including a first semiconductor region and a second semiconductor region separated from each other by a first shallow trench isolation (STI) region;
    forming a patterned photoresist covering said second semiconductor region and not covering any of said first semiconductor region;
    implanting ions into said semiconductor substrate in a first direction at a first non-zero tilt angle from a surface normal of said semiconductor substrate, wherein said first direction is within an x-z plane of a Cartesian coordinate system having a z-axis along said surface normal, and an entirety of said first semiconductor region and an entirety of said second semiconductor region are shielded from said ions by said patterned photoresist; and
    implanting additional ions into said semiconductor substrate in a second direction at a second non-zero tilt angle from said surface normal of said semiconductor substrate and with said patterned photoresist on said semiconductor substrate, wherein said second direction is within said x-z plane of said Cartesian coordinate system, said first direction and said second direction are different, and said entirety of said second semiconductor region is shielded from said additional ions by said patterned photoresist, and wherein said additional ions are implanted to an entirety of a surface portion of said first semiconductor region.

2. The method of claim 1, wherein said first semiconductor region has a semiconductor region width Wa, said first shallow trench isolation (STI) region has a shallow trench isolation width Ws, said patterned photoresist has a thickness t, an edge of said patterned photoresist extends over said first STI region by an overlap distance K from an edge of said second semiconductor region abutting said first STI region, and a sidewall of said patterned photoresist over said first STI region has a slope angle β from a surface normal of said semiconductor substrate, wherein said ions are implanted at an angle α from said surface normal, and wherein $X + t \times \tan(\alpha) - t \times \tan(\beta) > Ws + Wa$.

3. The method of claim 1, wherein a first unit vector representing said first direction and a second unit vector representing said second direction have a same vertical component parallel to said surface normal, and have opposite horizontal components in a plane perpendicular to said surface normal.

4. The method of claim 3, wherein said ions and said additional ions are implanted at an equal dose and comprise an identical ion specie.

5. The method of claim 4, further comprising performing a quad implantation into said semiconductor substrate, wherein said implanting of said ions and said implanting of said additional ions constitute two rounds of said quad implantation, wherein four rounds of ion implantation are performed in said quad implantation with a 90 degree azimuthal rotation of said semiconductor substrate around said surface normal of said semiconductor substrate between each pair of consecutive rounds, and wherein a tilt angle, an ion specie, and a dose are the same across said four rounds.

6. The method of claim 1, further comprising a gate conductor line located over said first semiconductor region.

7. A method of implanting ions into semiconductor substrates comprising:
    providing a first semiconductor substrate including a first semiconductor region and a second semiconductor region separated from each other by a first shallow trench isolation (STI) region;
    applying a first photoresist having a first thickness and a first resist sidewall slove angle to said first semiconductor substrate;
    patterning said first photoresist with a first pattern employing a lithographic mask, wherein said patterned first photoresist covers said second semiconductor region and extends from an edge of said second semiconductor region by a first overlap distance and does not cover any of said first semiconductor region;
    implanting first ions into said first semiconductor substrate in a first direction at a first non-zero tilt angle from a first surface normal of said first semiconductor substrate, wherein an entirety of said first semiconductor region and an entirety of said second semiconductor region are shielded from said first ions by said first patterned photoresist;
    providing a second semiconductor substrate including a third semiconductor region that has a same shape as said first semiconductor region and a fourth semiconductor region that has a same shape as said second semiconductor region, wherein said third and fourth semiconductor regions are separated from each other by a second shallow trench isolation (STI) region, wherein said second semiconductor substrate is a different from said first semiconductor substrate;
    applying a second photoresist having a second thickness and a second resist sidewall slope angle to said second semiconductor substrate;
    patterning said second photoresist with a second pattern employing said lithographic mask, wherein said patterned second photoresist covers said fourth semiconductor region and extends from an edge of said fourth semiconductor region by a second overlap distance and does not cover any of said third semiconductor region, and wherein said first pattern and said second pattern are the same; and
    implanting second ions into said second semiconductor substrate in a second direction at a second non-zero tilt angle from a second surface normal of said second semiconductor substrate, wherein an entirety of said third semiconductor region is shielded from said second ions by said second patterned photoresist, and wherein said second ions are implanted to an entirety of a surface portion of said fourth semiconductor region by setting said second thickness differently from said first thickness, by setting said second overlap distance differently from said first overlap distance, by setting said second non-zero tilt angle differently from said first non-zero tilt angle, by setting said second resist sidewall slope angle differently from said first resist sidewall slope angle, or a combination thereof.

8. The method of claim 7, wherein said first semiconductor region has a semiconductor region width Wa, said first shallow trench isolation (STI) region has a shallow french isolation width Ws, said patterned first photoresist has a first thickness $t_1$, an edge of said first patterned photoresist extends over said first STI region by a first overlap distance $X_1$ from an edge of said second semiconductor region abutting said first STI region, and a sidewall of said patterned first photoresist over said first STI region has a first slope angle $\beta_1$ from a first surface normal of said first semiconductor substrate, wherein said first ions are implanted at a first angle $\alpha_1$ from said first surface normal, and wherein $X_1 + t_1 \times \tan(\alpha_1) - t_1 \times \tan(\beta_1) > Ws + Wa$.

9. The method of claim 7, wherein said third semiconductor region has said semiconductor region width Wa, said second shallow trench isolation (STI) region has said shallow trench isolation width Ws, said patterned second photoresist has a second thickness $t_2$, an edge of said second patterned photoresist extends over said second STI region by a second overlap distance $X_2$ from an edge of said fourth semiconductor region abutting said second STI region, and a sidewall of said patterned second photoresist over said second STI region has a second slope angle $\beta_2$ from a second surface normal of said second semiconductor substrate, wherein said second ions are implanted at a second angle $\alpha_2$ from said second surface normal, and wherein $X_2 + t_2 \times \tan(\alpha_2) - t_2 \times \tan(\beta_2) < Ws$.

10. The method claim 7, further comprising implanting additional ions into said first semiconductor substrate with said patterned first photoresist on said first semiconductor substrate, wherein an entirety of said second semiconductor region is shielded from said additional ions by said patterned photoresist, and wherein said additional ions are implanted to an entirety of a surface portion of said first semiconductor region.

11. The method of claim 10, wherein said ions are implanted in a first direction at a first non-zero tilt angle from a surface normal of said first semiconductor substrate and said additional ions are implanted in a second direction at a second non-zero tilt angle from said surface normal of said first semiconductor substrate, wherein said first direction and said second direction are different.

12. The method of claim 11, wherein a first unit vector representing said first direction and a second unit vector representing said second direction have a same vertical component parallel to said surface normal, and have opposite horizontal components in a plane perpendicular to said surface normal.

13. A method of implanting ions into a semiconductor substrate comprising:
providing a semiconductor substrate including a first semiconductor region, a second semiconductor region, and a third semiconductor region, wherein said second semiconductor region is separated from said first semiconductor region by a first shallow trench isolation (STI) region and said third semiconductor region is separated from said first semiconductor region by a second shallow trench isolation (STI) region;
forming a patterned photoresist covering said second semiconductor region and not covering any of said first semiconductor region or said third semiconductor region; and
implanting ions into said semiconductor substrate in a first direction at a first non-zero tilt angle from a surface normal of said semiconductor substrate, wherein said first direction is within an x-z plane of a Cartesian coordinate system having a z-axis along said surface normal, and an entirety of said first semiconductor region and an entirety of said second semiconductor region are shielded from said ions by said patterned photoresist, and wherein said ions are implanted to an entirety of a surface portion of said third semiconductor region; and
implanting additional ions into said first semiconductor substrate in a second direction at a second non-zero tilt angle from said surface normal of said semiconductor substrate and with said patterned photoresist on said semiconductor substrate, wherein said second direction is within said x-z plane of said Cartesian coordinate system, said first direction and said second direction are different, and said entirety of said second semiconductor region is shielded from said additional ions by said patterned photoresist, and wherein said additional ions are implanted to an entirety of a surface portion of said first semiconductor region and to said entirety of said surface portion of said third semiconductor region.

14. The method of claim 13, wherein said first semiconductor region has a semiconductor region width Wa, said first shallow trench isolation (STI) region has a shallow trench isolation width Ws, said patterned photoresist has a thickness t, an edge of said patterned photoresist extends over said first STI region by an overlap distance X from an edge of said second semiconductor region abutting said first STI region, and a sidewall of said patterned photoresist over said first STI region has a slope angle $\beta$ from a surface normal of said semiconductor substrate, wherein said ions are implanted at an angle $\alpha$ from said surface normal, and wherein $X + t \times \tan(\alpha) - t \times \tan(\beta) > Ws + Wa$.

15. The method of claim 13, wherein a first unit vector representing said first direction and a second unit vector representing said second direction have a same vertical component parallel to said surface normal, and have opposite horizontal components in a plane perpendicular to said surface normal.

16. The method of claim 15, further comprising performing a quad implantation into said semiconductor substrate, wherein said implanting of said ions and said implanting of said additional ions constitute two rounds of said quad implantation, wherein four rounds of ion implantation are performed in said quad implantation with a 90 degree azimuthal rotation of said semiconductor substrate wound said surface normal of said semiconductor substrate between each pair of consecutive rounds, and wherein a tilt angle, an ion specie, and a dose are the same across said four rounds.

17. The method of claim 1, wherein an x-component of a first unit vector representing said first direction and an x-component of a second unit vector representing said second direction have opposite signs.

18. The method of claim 17, wherein said first non-zero tilt angle and said second non-zero tilt angle have the same magnitude.

19. The method of claim 13, wherein an x-component of a first unit vector representing said first direction and an x-component of a second unit vector representing said second direction have opposite signs.

20. The method of claim 19, wherein said first non-zero tilt angle and said second non-zero tilt angle have the same magnitude.

* * * * *